United States Patent
Ngo et al.

(10) Patent No.: US 6,548,403 B1
(45) Date of Patent: Apr. 15, 2003

(54) SILICON OXIDE LINER FOR REDUCED NICKEL SILICIDE BRIDGING

(75) Inventors: Minh Van Ngo, Fremont, CA (US); Christy Mei-Chu Woo, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/679,871

(22) Filed: Oct. 5, 2000

(51) Int. Cl.⁷ ............................................... H01L 21/44
(52) U.S. Cl. ..................... 438/682; 438/683; 438/685
(58) Field of Search ................................ 438/682, 683, 438/685

(56) References Cited

U.S. PATENT DOCUMENTS

| | | | |
|---|---|---|---|
| 5,783,479 A | * 7/1998 | Lin et al. | 438/592 |
| 5,851,890 A | 12/1998 | Tsai et al. | 438/303 |
| 5,930,617 A | 7/1999 | Wu | 438/233 |
| 6,063,680 A | 5/2000 | Wu | 438/303 |
| 6,074,922 A | 6/2000 | Wang et al. | 438/303 |
| 6,087,234 A | 7/2000 | Wu | 438/299 |
| 6,117,737 A | 9/2000 | Wang et al. | 438/275 |
| 6,171,959 B1 | * 1/2001 | Nagabushnam | 438/471 |
| 6,184,132 B1 | * 2/2001 | Cantell et al. | 438/664 |
| 6,188,117 B1 | * 2/2001 | Jan et al. | 257/413 |
| 6,303,523 B2 | * 10/2001 | Cheung et al. | 427/249.15 |
| 6,344,388 B1 | * 2/2002 | Oishi et al. | 438/241 |
| 6,383,880 B1 | * 5/2002 | Ngo et al. | 438/303 |
| 6,387,767 B1 | * 5/2002 | Besser et al. | 438/305 |
| 6,432,805 B1 | * 8/2002 | Paton et al. | 438/592 |
| 6,465,349 B1 | * 10/2002 | Ngo et al. | 438/682 |
| 6,483,154 B1 | * 11/2002 | Ngo et al. | 257/384 |

* cited by examiner

*Primary Examiner*—Richard Elms
*Assistant Examiner*—Christian D. Wilson

(57) ABSTRACT

Bridging between nickel silicide layers on a gate electrode and source/drain regions along silicon nitride sidewall spacers is prevented by forming a relatively thick silicon oxide liner on the side surfaces of the gate electrode and adjacent surface of the semiconductor substrate before forming the silicon nitride sidewall spacers thereon. Embodiments include forming a silicon dioxide liner at a thickness of about 200 Å to about 600 Å prior to forming the silicon nitride sidewall spacers thereon.

12 Claims, 2 Drawing Sheets

SILICON OXIDE LINER FOR REDUCED NICKEL SILICIDE BRIDGING

RELATED APPLICATION

This application contains subject matter similar to subject matter disclosed in copending U.S. patent applications: Ser. No. 09/679,372, filed on Oct. 5, 2000; Ser. No. 09/679,373, filed on Oct. 5, 2000; Ser. No. 09/679,374, filed on Oct. 5, 2000; Ser. No. 09/679,880, filed on Oct. 5, 2000; and Ser. No. 09/679,375, filed on Oct. 5, 2000.

TECHNICAL FIELD

The present invention relates to the fabrication of semiconductor devices, particularly to self-aligned silicide (salicide) technology, and the resulting semiconductor devices. The present invention is particularly applicable to ultra large scale integrated circuit (ULSI) systems having features in the deep sub-micron regime.

BACKGROUND ART

As integrated circuit geometries continue to plunge into the deep sub-micron regime, it becomes increasingly more difficult to accurately form discreet devices on a semiconductor substrate exhibiting the requisite reliability. High performance microprocessor applications require rapid speed of semiconductor circuitry. The speed of semiconductor circuitry varies inversely with the resistance (R) and capacitance (C) of the interconnection system. The higher the value of the RxC product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various metal silicides have been employed in salicide technology, such as titanium, tungsten, and cobalt. Nickel, however, offers particularly advantages vis-à-vis other metals in salicide technology. Nickel requires a lower thermal budget in that nickel silicide and can be formed in a single heating step at a relatively low temperature of about 250° C. to about 600° C. with an attendant reduction in consumption of silicon in the substrate, thereby enabling the formation of ultra-shallow source/drain junctions.

In conventional salicide technology, a layer of the metal is deposited on the gate electrode and on the exposed surfaces of the source/drain regions, followed by heating to react the metal with underlying silicon to form the metal silicide. Unreacted metal is then removed from the dielectric sidewall spacers leaving metal silicide contacts on the upper surface of the gate electrode and on the source/drain regions. In implementing salicide technology, it was also found advantageous to employ silicon nitride sidewall spacers, since silicon nitride is highly conformal and enhances device performance, particularly for p-type transistors. However, although silicon nitride spacers are advantageous from such processing standpoints, it was found extremely difficult to effect nickel silicidation of the gate electrode and source/drain regions without undesirable nickel silicide bridging and, hence, short circuiting, therebetween along the surface of the silicon nitride sidewall spacers.

Accordingly, there exists a need for salicide methodology enabling the implementation of nickel suicide interconnection systems without bridging between the nickel silicide layers on the gate electrode and the source/drain regions, particularly when employing silicon nitride sidewall spacers on the gate electrode.

DISCLOSURE OF THE INVENTION

An advantage of the present invention is a method of manufacturing a semiconductor device having nickel silicide contacts on a gate electrode and associated source/drain regions without bridging therebetween along insulative sidewall spacers, notably silicon nitride sidewall spacers.

Another advantage of the present invention is a semiconductor device having nickel silicide contacts on a gate electrode and associated source/drain regions without bridging therebetween along insulative sidewall spacers, particularly silicon nitride sidewall spacers.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon gate electrode, having opposing side surfaces, on an upper surface of a semiconductor substrate with a gate insulating layer therebetween; forming a silicon oxide liner, at a thickness of about 300 Å to about 600 Å, on the opposing side surfaces of the gate electrode and on the upper surfaces of the semiconductor substrate adjacent the opposing side surfaces of the gate electrode; forming silicon nitride sidewall spacers on the opposing side surface of the gate electrode with the silicon oxide liner therebetween; depositing a layer of nickel on the gate electrode and on exposed substrate surfaces; and heating to react the layer of nickel with underlying silicon to form a layer of nickel silicide on the gate electrode and layers of nickel silicide on the exposed surfaces of the substrate.

Embodiments of the present invention include heating to form the nickel silicide layers on the gate electrode and substrate surface, resulting in a thin nickel silicide layer formed on the silicon nitride sidewall spacers, as at a thickness of about 30 Å to about 60 Å, wherein the silicon oxide liner, e.g., silicon dioxide liner, prevents the thin nickel silicide layers on the sidewall spacers from contacting the nickel silicide layer on the gate electrode and/or contacting the nickel silicide layers on the semiconductor substrate. Embodiments of the present invention further include sputter etching in argon after depositing the layer of nickel to remove contamination prior to forming the nickel silicide layers at a temperature of about 400° C. to about 600° C.

Another aspect of the present invention is a semiconductor device comprising: a gate electrode, having opposing side surfaces and an upper surface, on an upper surface of a semiconductor substrate with a gate insulating layer therebetween; a silicon oxide liner, having a thickness of about 200 Å to about 600 Å, on the opposing side surfaces of the gate electrode and on the upper surface of the semiconductor substrate adjacent the oppssing side surfaces of the gate electrode; silicon nitride sidewall spacers on the oxide liner; a layer of nickel silicide on the upper surface of the gate electrode; and a layer of nickel silicide on the substrate surface adjacent each silicon nitride sidewall spacer. Advantageously, the oxide liner prevents nickel silicide formed on the silicon nitride sidewall spacers from contacting the nickel silicide layer on the gate electrode and/or contacting the nickel silicide layers on the semiconductor substrate, thereby preventing bridging therebetween Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
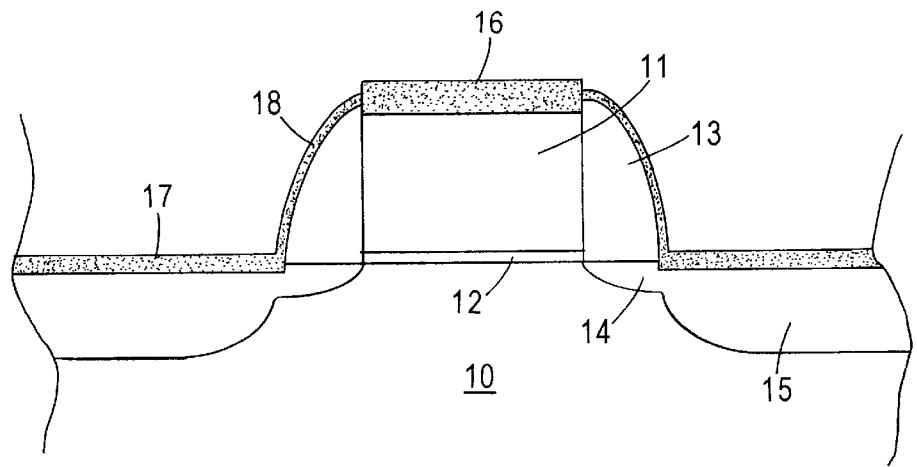
FIG. 1 schematically illustrates problematic nickel silicide bridging attendant upon conventional practices.

The present invention addresses and solves problems attendant upon implementing conventional salicide technology employing nickel as the metal for silicidation. As device geometries shrink into the deep sub-micron regime, nickel silicide bridging occurs along the surface of silicon nitride sidewall spacers between the nickel silicide layer on the gate electrode and nickel silicide layers on associated source/drain regions. For example, adverting to FIG. 1, a gate electrode 11 is formed on substrate 10 with gate insulating layer 12 therebetween. Silicon nitride spacers 13 are formed on opposing side surfaces of gate electrode 11. Shallow source/drain extensions 14 and source/drain regions 15 are formed in substrate 10. A layer of nickel is deposited followed by heating to form a nickel suicide layer 16 on the upper surface of gate electrode 11 and a layer of nickel silicide 17 on associated source/drain regions 15. However, it was found that a thin layer of nickel silicide 18, typically at a thickness of about 30 Å to about 60 Å, is undesirably formed along the exposed surfaces of the silicon nitride sidewall spacers 13 causing bridging and, hence, shorting between nickel silicide layer 16 and nickel silicide layers 17. After considerable experimentation and investigation, it was postulated that the problem of nickel silicide formation 18 along the silicon nitride sidewall spacers 13 stemmed from the reaction of nickel with dangling silicon bonds in the silicon nitride sidewall spacer.

In accordance with embodiments of the present invention, an oxide liner is formed on the side surfaces of the gate electrode and on the surface of the semiconductor substrate adjacent the side surfaces of the gate electrode prior to forming the silicon nitride sidewall spacers. The oxide liner is formed at a sufficient thickness to maintain the nickel silicide layer formed on the silicon nitride sidewall spacers at a distance spaced apart from and, hence, preventing contact between the nickel silicide layer formed on the gate electrode and/or the nickel silicide layers formed on the surface of the semiconductor substrate. Thus, the silicon oxide liner is formed at a sufficient thickness to function as a spacer between the nickel silicide layer on the sidewall spacer and/or the nickel silicide layers on the gate electrode and/or nickel silicide layers on the semiconductor substrate. Given the disclosed objectives and guidance of the present disclosure, the optimum thickness, for the silicon oxide liner can be readily determined in a particular situation. For example, it was found suitable to form the silicon oxide liner at a thickness of about 200 Å to about 600 Å. Accordingly, embodiments of the present invention enable nickel silicidation without undesirable bridging, such as that denoted by reference numeral 18 in FIG. 1.

Figure 2:
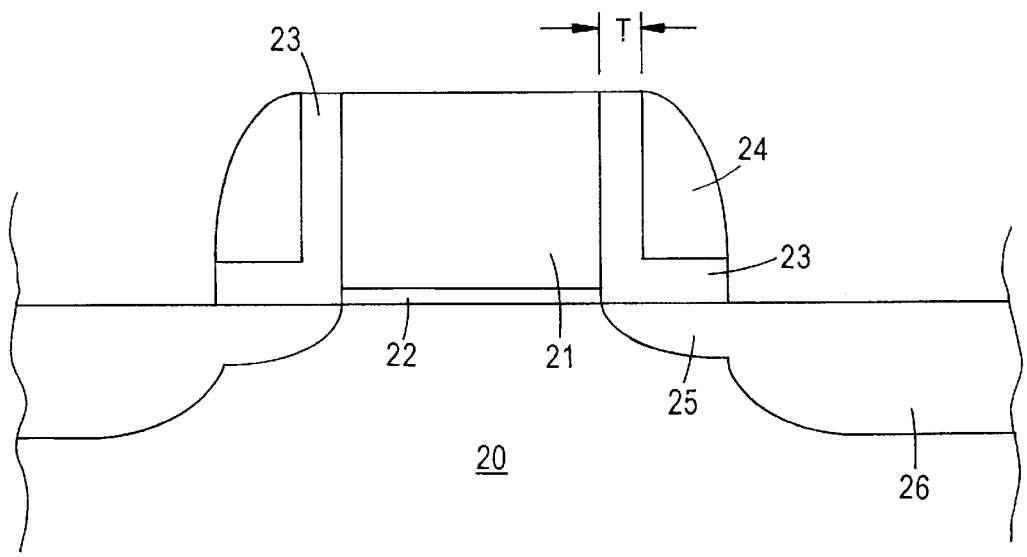
FIGS. 2 and 3 schematically illustrate sequential phases in accordance with an embodiment of the present invention, wherein like features are denoted by like reference numerals.
Figure 3:
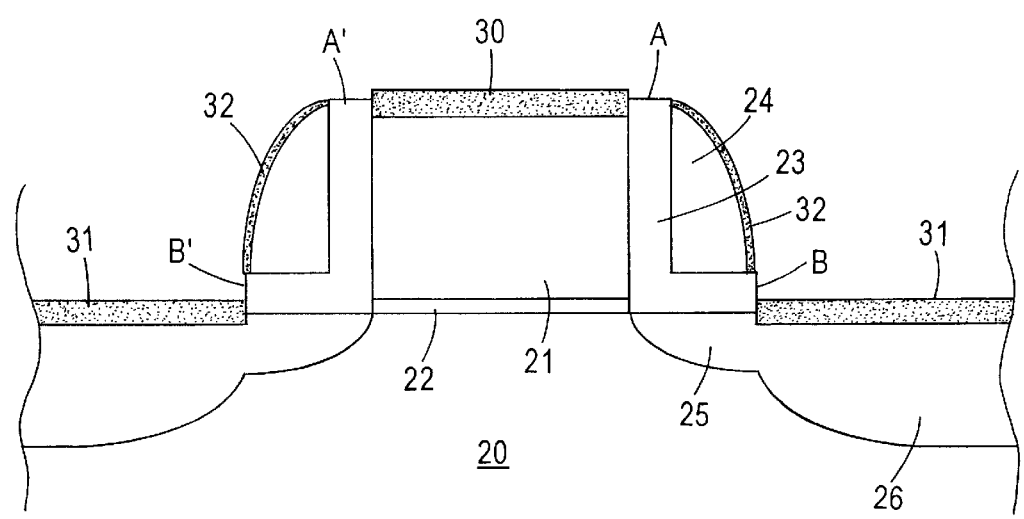

An embodiment of the present invention is schematically illustrated in FIGS. 2 and 3, wherein similar reference numerals denote similar features. Adverting to FIG. 2, a gate electrode 21, e.g., doped polycrystalline silicon, is formed on semiconductor substrate 20, which can be n-type or p-type, with a gate insulating layer 22 therebetween. Gate insulating layer is typically silicon dioxide formed at a thickness of about 30 Å to about 90 Å by thermal oxidation or chemical vapor deposition (CVD). In accordance with embodiments of the present invention, a relatively thick oxide liner 23, as at a thickness (T) of about 200 Å to about 600 Å, is formed on the opposing side surfaces of gate electrode 21 and an adjacent surfaces of substrate 20. Silicon oxide liner 23 can be formed by plasma enhanced chemical vapor deposition (PECVD) using silane at a flow rate of about 50 to about 100 sccm, $N_2O$ at a flow rate of about 1,000 to about 4,000 sccm, a RF power of about 100 watts to about 300 watts, a pressure of about 2.4 Torr. to about 3.2 Torr., and a temperature of about 380° C. to about 420° C., e.g., about 400° C., typically for about 2 to about 20 seconds. Silicon oxide liner 23 not only prevents consumption of the gate electrode 21 by silicidation from the side surfaces thereof, but advantageously prevents the subsequently formed thin layer of nickel silicide on silicon nitride sidewall spacers from contacting the nickel silicide contact layer on the upper surface of gate electrode 21 and/or from contacting the nickel silicide contact layers on the upper surface of substrate 20 and, hence, prevents nickel silicide bridging along the silicon nitride sidewall spacers.

Subsequent to forming silicon oxide liner 23, silicon nitride sidewall spacers 24 are formed by depositing a conformal layer and anisotropically etching. Silicon nitride sidewall spacers can be formed by PECVD employing a silane flow rate of about 200 to about 400 sccm, e.g, about 375 sccm, a nitrogen flow rate of about 2,000 to about 4,000 sccm, e.g., about 2,800 sccm, an ammonia flow rate of about 2,500 to about 4,000 sccm, e.g., about 3,000 sccm, a high frequency RF power of about 250 watts to about 450 watts, e.g., about 350 watts, a low frequency RF power of about 100 to about 200 watts, e.g., about 140 watts, a pressure of about 1.6 Torr. to about 2.2 Torr., e.g., about 1.9 Torr., and a temperature of about 380° C. to about 420° C., e.g., about 400° C. The silicon nitride sidewall spacers typically have a thickness of about 300 Å to about 700 Å.

Prior to depositing nickel, it was found particularly suitable to conduct argon sputter etching to remove contamination. Sputter etching techniques are conventional and, hence, not set forth herein in detail. Such techniques are typically implemented in an inductively coupled plasma source sputter etch chamber in which a pedestal supports an electrostatic chuck and functions as an RF powered cathode. The chamber walls typically form an RF anode. An electrostatic attractive force is generated by the chuck to retain the wafer in a stationary position during processing. A voltage is applied to one or more electrodes embedded within a ceramic chuck body to induce opposite plurality charges in the wafer and electrodes, respectively. The opposite charges pull the wafer against the chuck support surface, thereby electrostatically clamping the wafer. An additional coil in the outside surface of the chamber lid is energized with RF power that inductively couples through the lid and into the chamber. The electric field generated between the anode and cathode along with the inductively coupled power from the coil ionizes a reactment gas introduced into the chamber, e.g., argon, to produce a plasma. Ions from the plasma bombard the wafer to effect etching.

Subsequent to sputter etching, a layer of nickel is deposited, as at a thickness of about 100 Å to about 300 Å, e.g., about 200 Å, followed by rapid thermal annealing, as at a temperature of about 250° C. to about 600° C., e.g., about 400° C. to about 600° C. During such thermal treatment, nickel silicide layer 30, illustrated in FIG. 3, is formed on gate electrode 21 while nickel silicide layers 31 are formed on exposed portions of the substrate adjacent sidewall spacers 24. Nickel silicide layers 30 and 31 typically have a thickness of about 100 Å to about 300 Å, e.g., about 200 Å. Nickel silicide layers 32, typically having a thickness of about 30 Å to about 60 Å, are also formed on silicon nitride sidewall spacers, presumably by reaction of nickel with dangling silicon bonds. However, in accordance with embodiments of the present invention, the silicon oxide liner 23, is formed at a sufficient thickness to prevent nickel silicide layers 32 from contacting nickel silicide layer 30 and/or nickel silicide layers 31. Thus, portions "A" and "A'" of silicon oxide liner 23 prevent contact between nickel silicide layers 32 and 30, while portion "B" and "B'" of silicon oxide liner 23 prevent contact between nickel silicide layers 32 and nickel silicide layers 31. Unreacted nickel on the surfaces of the silicon nitride sidewall spacers 24 is removed, as by a wet processing technique, e.g., treating with a mixture of sulfuric acid and hydrogen peroxide with a ratio of sulfuric acid: hydrogen peroxide of about 1:12 to about 1:4, e.g., about 1:2.

The present invention, therefore, enables the implementation of nickel salicide methodology, advantageously utilizing silicon nitride sidewall spacers without bridging between the nickel silicide layer formed on the upper surface of the gate electrode and the nickel silicide layers formed on associated source/drain regions by providing a sufficiently thick silicon oxide liner between the gate electrode and silicon nitride sidewall spacers. The silicon oxide liner maintains any nickel silicide formed on the sidewall spacers at a sufficient distance from the nickel silicide layer on the gate electrode and/or nickel silicide layers on the substrate surface to prevent bridging therebetween The present invention is applicable to the production of any of various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a silicon gate electrode, having opposing side surfaces, on an upper surface of a semiconductor substrate with a gate insulating layer therebetween;

depositing a silicon oxide liner by plasma enhanced chemical vapor deposition, at a thickness of about 200 Å to about 600 Å, on the opposing side surfaces of the gate electrode and on the upper surface of the semiconductor substrate adjacent the opposing side surfaces of the gate electrode;

forming silicon nitride sidewall spacers on the opposing side surfaces of the gate electrode with the silicon oxide liner therebetween;

depositing a layer of nickel on the gate electrode and on exposed surfaces of the substrate; and heating to react the layer of nickel with underlying silicon to form a layer of nickel silicide on the gate electrode and layers of nickel silicide on the exposed surfaces of the substrate, wherein:

a layer of nickel silicide is formed on the silicon nitride sidewall spacers during heating; and the silicon oxide liner prevents the nickel silicide layer on the sidewall spacers from contacting the nickel layer on the gate electrode and/or contacting the nickel silicide layers on the substrate surface.

2. The method according to claim 1, wherein the silicon oxide liner is silicon dioxide.

3. The method according to claim 1, wherein the layer of nickel silicide formed on the silicon nitride sidewall spacers has a thickness of about 30 Å to about 60 Å.

4. The method according to claim 1, comprising forming the silicon oxide liner by plasma enhanced chemical vapor deposition at a:

silane flow rate of about 50 to about 100 sccm;

nitrogen oxide flow rate of about 1,000 to about 4,000 sccm;

RF power of about 100 to about 300 watts;

pressure of about 2.4 to about 3.2 Torr.; and temperature of about 380° C. to about 420° C.

5. The method according to claim 4, comprising depositing the oxide liner for about 2 seconds to about 20 seconds.

6. The method according to claim 1, comprising forming the silicon nitride sidewall spacers at a thickness of about 300 Å to about 700 Å.

7. The method according to claim 1, comprising forming source/drain regions in the semiconductor substrate proximate the opposing side surfaces of the gate electrode, wherein the nickel silicide layers on the exposed substrate surfaces function as source/drain contacts.

8. The method according to claim 1, comprising depositing the layer of nickel at a thickness of about 100 Å to about 300 Å.

9. The method according to claim 1, comprising sputter etching in argon before depositing the layer of nickel.

10. The method according to claim 1, comprising heating at a temperature of about 400° C. to about 600° C. to form the layers of nickel silicide.

11. The method according to claim 1, comprising removing unreacted nickel from the silicon nitride sidewall spacers.

12. The method according to claims 11, comprising removing unreacted nickel from the silicon nitride sidewall spacers with a mixture comprising sulfuric acid and hydrogen peroxide.

* * * * *

UNITED STATES PATENT AND TRADEMARK OFFICE
CERTIFICATE OF CORRECTION

PATENT NO.     : 6,548,403 B1
DATED          : April 15, 2003
INVENTOR(S)    : Minh Van Ngo et al.

It is certified that error appears in the above-identified patent and that said Letters Patent is hereby corrected as shown below:

<u>Column 6,</u>
Line 30, change "silicon" to -- silicide --

Signed and Sealed this

Twelfth Day of August, 2003

JAMES E. ROGAN
*Director of the United States Patent and Trademark Office*